United States Patent
Herbst et al.

(10) Patent No.: US 9,103,897 B2
(45) Date of Patent: Aug. 11, 2015

(54) METHOD FOR QUASI-CONTINUOUS DYNAMIC MOTION CORRECTION IN MAGNETIC RESONANCE MEASUREMENTS

(75) Inventors: Michael Herbst, Freiburg (DE); Maxim Zaitsev, Freiburg (DE); Julian Maclaren, Freiburg (DE); Matthias Weigel, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 609 days.

(21) Appl. No.: 13/447,325

(22) Filed: Apr. 16, 2012

(65) Prior Publication Data
US 2012/0268124 A1    Oct. 25, 2012

(30) Foreign Application Priority Data
Apr. 18, 2011   (DE) .................. 10 2011 007 574

(51) Int. Cl.
*G01R 33/565*   (2006.01)
*G01R 33/567*   (2006.01)

(52) U.S. Cl.
CPC ...... *G01R 33/56509* (2013.01); *G01R 33/5673* (2013.01)

(58) Field of Classification Search
USPC .................................................. 324/309
See application file for complete search history.

(56) References Cited

U.S. PATENT DOCUMENTS

| | | | |
|---|---|---|---|
| 6,885,885 B1 | 4/2005 | Takizawa | |
| 7,123,007 B2 * | 10/2006 | Katscher et al. | 324/309 |
| 7,295,007 B2 | 11/2007 | Dold | |
| 7,573,269 B2 * | 8/2009 | Yao | 324/309 |
| 2001/0005135 A1 | 6/2001 | Thesen | |
| 2007/0265520 A1 | 11/2007 | Posse | |
| 2007/0280508 A1 | 12/2007 | Ernst | |

(Continued)

FOREIGN PATENT DOCUMENTS

EP      2515139 A1 * 10/2012
WO      WO 2007/136745    11/2007

OTHER PUBLICATIONS

Orchard et Staruch, MRI Reconstruction using Real-Time Motion Tracking: A Simulation Study, Oct. 26, 2008, Signals, Systems and Computers 42nd Asilomar Conference ON, pp. 1910-1914.*

(Continued)

*Primary Examiner* — Melissa Koval
*Assistant Examiner* — Maxwell A Tibbits
(74) *Attorney, Agent, or Firm* — Paul Vincent

(57) ABSTRACT

A method of MR imaging and spectroscopy to reduce artifacts occurring due to the motion of an object to be represented, wherein the object position is determined quasi-continuously during the runtime of the MR acquisition, which includes one or more partial acquisitions (TA), and wherein motion correction is performed, which comprises dynamic adaptation of the frequency and phase settings of the RF system of the tomograph and of the orientation and amplitudes of the gradients during the runtime of the MR acquisition according to the current object position. The motion correction is thereby applied during a signal weighting period, during a signal read-out period, or between and/or during the two stated periods and the adaptations for motion correction are performed without interrupting or slowing the temporal progression of the MR acquisition. In this way, artifacts due to motion of the object to be represented can be further reduced.

18 Claims, 8 Drawing Sheets

(56) References Cited

U.S. PATENT DOCUMENTS

2009/0209846 A1* 8/2009 Bammer .................. 600/421
2011/0038520 A1 2/2011 Yui

OTHER PUBLICATIONS

M. Zaitsev et al., "Magnetic resonance imaging of freely moving objects: Prospective real-time motion correction using an external optical motion tracking system", Neuroimage, 2006. 31(3): p. 1038-1050.

Murat Aksoy et al., "Real-Time Optical Motion Correction for Diffusion Tensor Imaging", Magnetic Resonance in Medicine, 2011. 66(2): p. 366-378.

Orchard, Jeff et al., "MRI Reconstruction using Real-Time Motion Tracking: A Simulation Study" Signals, Systems and Computers, 2008 42nd Asilomar Conference ON, IEEE, Piscataway, NJ, USA, Oct. 26, 2008, Pa. 1910-1914.

Nehrke, Kay et al., "Prospective Correction of Affine Motion for Arbitrary MR Sequences on a Clinical Scanner", Magnetic Resonance in Medicine 54:1130-1138 (2005).

Ooi, Melvyn B. et al., "Prospective Real-Time Correction for Arbitrary Head Motion Using Active Markers", Magnetic Resonance in Medicine 62:943-954 (2009).

Dold, Christian et al., "Advantages and Limitations of Prospective Head Motion Compensation for MRI Using an Optical Motion Tracking Device[1]", Acad Radiol 2006; 13:1093-1103.

Hu, P. et al., "Motion Correction using Coil Arrays (MOCCA)", Proc. Intl. Soc. Mag. Reson. Med., Jan. 1, 2010, Pa. 3058.

* cited by examiner

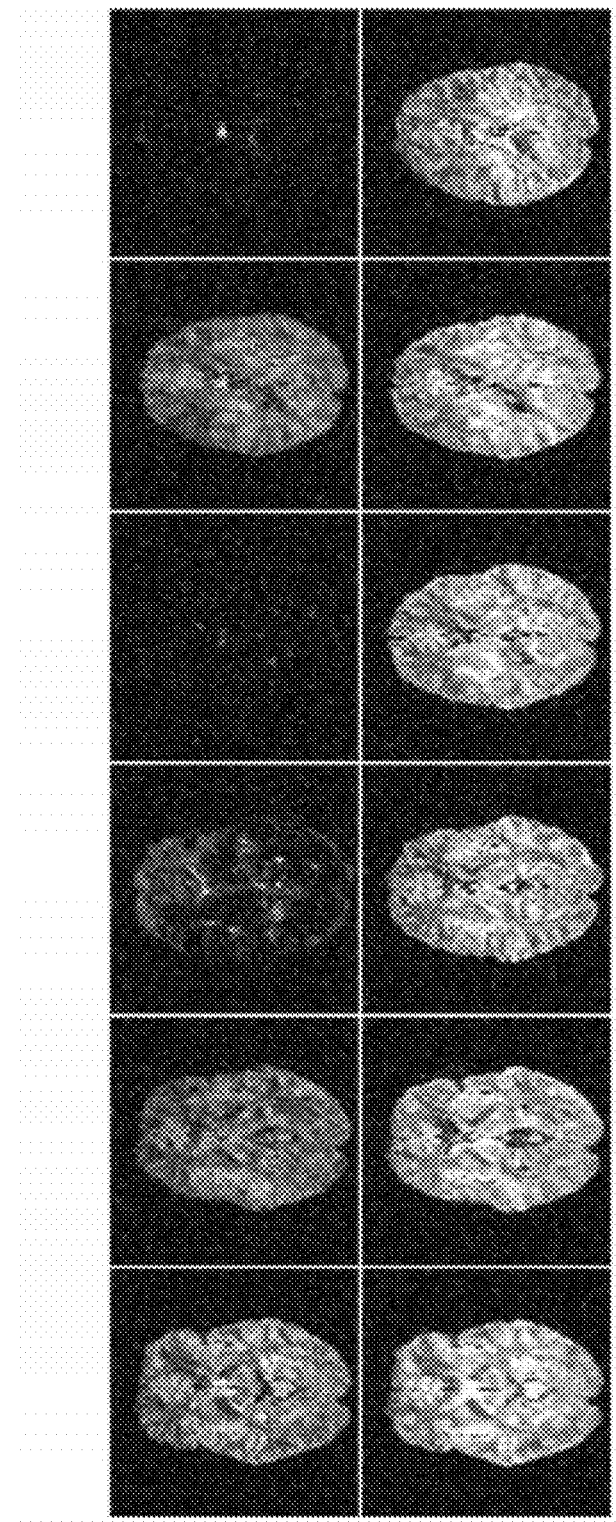

METHOD FOR QUASI-CONTINUOUS DYNAMIC MOTION CORRECTION IN MAGNETIC RESONANCE MEASUREMENTS

This application claims Paris Convention priority of DE 10 2011 007 574.7 filed on Apr. 18, 2011.

BACKGROUND OF THE INVENTION

The invention relates to a method for MR (=magnetic resonance) imaging and spatially resolved MR spectroscopy using an MR tomograph to reduce artifacts occurring due to the motion of an object to be represented, wherein the object position is determined quasi-continuously during the runtime of the MR acquisition, which includes one or more partial acquisitions, and wherein motion correction is performed, which comprises dynamic adaptation of the frequency and phase settings of the RF (=radio frequency) system of the tomograph and of the orientation and amplitudes of the gradients during the runtime of the MR acquisition according to the current object position.

Such a method is known from US 2009/0209846 A1 (=reference [1]).

MR tomography, also known as magnetic resonance imaging (=MRI), MR imaging or magnetic resonance tomography (=MRT) is a non-invasive method that makes it possible to spatially resolve the inner structure of objects in three dimensions and to represent them. It is based on the energy behavior of atomic nuclei in a magnetic field, which permits excitation of its nuclear spins by suitable radio-frequency pulses, followed by analysis of the reaction. MR imaging is mainly used in medicine to provide a view into the interior of a human body.

The signal emitted from the atomic nuclei of the object being examined as a reaction to excitation with radio-frequency pulses is read using suitable receiver coils. The spatial encoding required to be able to allocate the measurement signal to a position within the object to be represented is achieved with additional, spatially variable magnetic fields $B_z(x,y,z)$ that are superposed on the static main magnetic field $B_0$, causing atomic nuclei at different positions to exhibit different Larmor frequencies. Conventionally, magnetic fields are used that exhibit the most linear possible variation in intensity in the relevant spatial direction, termed constant or linear magnetic field gradients. The customary gradient systems produce three orthogonal gradients in the x-, y-, and z-directions in this way, but local gradient systems are also used in spatial encoding. 1-, 2-, or 3-dimensional spatial encoding is performed by varying the magnetic field gradient in all three spatial directions according to known principles, for example, Fourier encoding, filtered back-projection, or another known method [11].

To generate a signal that can be used for MR, spatially variable magnetic fields and RF pulses are superposed on a stationary magnetic field. Error-free, in particular, artifact-free mapping is only possible if the measurement object to be represented is completely motionless for the entire representation process.

Image artifacts and signal disturbances that occur due to motion during the representation process limit the image quality that can be achieved. In everyday clinical practice, patient movements can result in unusable acquisitions, which can result in lost time because acquisitions have to be repeated, or even incorrect diagnoses.

The possibility of detecting and correcting movements that occur is therefore an essential factor in ensuring the quality of the data obtained by MR. In particular, in everyday clinical practice, avoidance of motion artifacts increases the efficiency of the measurement procedure and considerably reduces the costs. Such a procedure for realtime motion correction during the MR acquisition is known from [1] cited above.

To avoid motion artifacts in MR acquisitions, three basic approaches are known:

1.) In so-called gating, the acquisition is interrupted as soon as the measurement object is no longer in the desired position and resumed as soon as it is in the desired position again. Gating of respiratory motion is used especially frequently for acquisitions of the abdominal and thoracic regions of patients. This method has the disadvantage that the duration of an MR acquisition is considerably increased.[2]

2.) In retrospective correction, the MR acquisition is performed without change even when an object movement occurs; it does not alter the temporal progression of the acquisition. However, retrospective correction is only possible for a limited number of image artifacts. Retrospective methods are no use for movements that result in inconsistent image objects or signal loss. [3]

3.) Prospective motion correction enables reduction of the artifacts caused by patient motion by adapting the volume to be represented to the current position of the measurement object. For this purpose, the position of the measurement object to be represented is sensed by a measurement system or measurement method throughout the MR acquisition. If movement of the measurement object is observed, dynamic adaptations of the frequency and the phase settings of the radio-frequency system (RF system) of the tomograph and of the orientation and amplitudes of the gradients are performed.

One possible measurement method acquires the position data using MR navigator sequences. These navigator sequences require a short interruption in the sequence and can therefore only be used for certain acquisitions and permit only a few corrections per second. [4, 5] One promising approach is installation of a measurement system (e.g. an optical measurement system) inside or outside the tomograph. In this way, it is possible to obtain information about the object position concurrently with MR acquisition. [1, 6-8]

An acquisition by means of MR tomography generally consists of individual partial processes comprising signal generation and/or signal acquisition with a typical duration >4 ms. Before such a partial acquisition starts, all the parameters (gradients, RF pulses, carrier frequencies and phases) required for the partial acquisition are calculated.

Two basic approaches for prospective motion correction are described:

1.) For correction using a software interface, calculation of individual partial acquisitions is adapted to the changed position of the measurement object and the relevant parameters are calculated based on this position. The calculated sequence parameters are then transmitted digitally to a signal generator.[1, 6-10]

2.) In motion correction using a hardware interface, these digital signals of calculated partial acquisitions are adapted to the changed position of the measurement object. During short idle phases (<2 ms) between individual partial acquisitions, the digital signals of the following partial acquisition are adapted to the changed object position.[1, 9]

[6] describes a method for motion correction for arbitrary acquisitions. Before slice excitation, adaptation to the object position is performed. As an additional option, after the signal read-out period, the object position is determined again and if it exceeds certain limits of motion, the partial acquisition is performed again. Movements during the remaining temporal progression of the individual partial acquisitions are not corrected.

[7] describes a configuration of a system for motion correction. The motion correction is performed at the beginning of each partial acquisition. Motion correction during the temporal progression of the individual partial acquisitions is not described.

[1] describes a method for motion correction for arbitrary acquisitions. For the actual application of the motion correction, two possibilities are suggested (using a software interface and using a hardware interface). In the first case with a software interface, motion correction is performed at the beginning of each sequence-specific partial acquisition. Motion correction during the temporal progression of the individual partial acquisitions (in particular, uninterrupted motion correction of continuous gradients) is not described. In the second case using a hardware interface, the motion correction is performed in the short idle periods between 2 partial acquisitions. Motion correction during the temporal progression of the individual partial acquisitions is likewise not described.

[8] describes a configuration of a system for motion correction. At the beginning of each partial acquisition, one motion correction is performed, but not during the temporal progression of the individual partial acquisitions.

[10] presents a method for motion correction using the method described in [7]. The object position is only adapted before each slice excitation.

[9] presents a method for motion correction during an acquisition for diffusion-weighted imaging (DWI) using the method described in [1]. For this purpose, motion corrections are used before each slice excitation and before each signal read-out period. Movements that occur between slice excitation and signal read-out period are only detected and the affected partial acquisitions are rejected and repeated.

[5] describes a method that compensates for object rotation during diffusion weighting in DWI by a combination of navigator sequences and additionally run correction gradients. With this correction variant, only artifacts caused by rotations of the measurement object are corrected during the applied gradients. This correction also requires interruption of acquisition to run the navigator sequence and to run the correction gradients. Motion that occurs during the temporal progression of a partial acquisition (depending on the acquisition method, in the range 4 to 1000 ms) can result in serious artifacts and signal loss. None of the methods presented so far describes a way of correcting these—the only way is to repeat the partial acquisition(s) affected, which prolongs the duration of the MR acquisition accordingly.

In contrast thereto, it is the object of this invention to still further reduce the artifacts caused by movements of the object to be represented in an MR imaging or spectroscopy method described above.

SUMMARY OF THE INVENTION

According to the invention, this object is achieved in a surprisingly simple but effective manner in that the motion correction is applied during a signal weighting period, during a signal read-out period, or between and/or during the two stated periods, and that the adaptations for motion correction can be performed without interrupting or slowing the temporal progression of the MR acquisition.

Unlike known methods used for motion correction, which do not permit dynamic adaptation within a partial acquisition, the intensive motion correction is preferably performed multiple times (and ideally quasi-continuously, i.e. at intervals <3 ms, depending on the availability of the object position data) during partial acquisition. Dynamic correction is understood to be motion correction performed with updated parameters during the temporal progression of at least one of the two stated periods (signal weighting and signal read-out period).

It must be emphasized that only by such multiple adaptation during single partial acquisitions can important criteria of MR imaging and spectroscopy be met:

1.) The timing of the MR acquisition with quasi-continuous motion correction must be complied with (no time demand for motion correction).
   One problem of many methods already described is that the time progression of the MR acquisition has to be adapted for motion correction. If the required interruption in the signal progression of the sequence does not arise, or cannot be created, no motion correction is possible. The inventive method permits motion correction without changing the temporal progression of the MR acquisition by determining and/or calculating required parameters concurrently with the MR acquisition, the time required for determination/calculations being included.

2.) For MR acquisitions, it is important to apply a defined effective gradient relative to the measurement object. It is essential that the effective gradient area—also termed zeroth moment or gradient moment—meets exactly the requirements for each encoding axis (Gx, Gy, and Gz) before the signal read-out period. This condition is disturbed by object motion, in particular, rotations. The presented inventive method corrects this by correcting the gradients quasi-continuously during movement and thus ensuring that this necessary phase development is achieved directly in the actual, measured object, which ensures the desired signal evolution.

3.) It is also essential that the originally set phase relationships of the RF pulses, the so-called initial phases, are retained. This is especially important for multi-pulse sequences (e.g. echo train sequences such as RARE). If the object moves, this condition might be disturbed. The presented method permits restoration of phase stability by adapting the carrier frequencies and phases of the RF pulses according to the motion correction so that the intended, initial phases of the RF pulses are retained in the measured object. Residual errors in the preceding refocusing intervals can be taken into account.

A variant of the inventive method is especially preferred in which the long partial acquisitions are divided into shorter partial acquisition partitions, wherein long gradients that extend in time over the limit of two consecutive partial acquisition partitions are divided into shorter partial gradients in such a way that each partial gradient is only switched during a single partial acquisition partition. Final calculation of all parameters required for each partial acquisition partition is performed sequentially and includes the current position data. Please note that this variant of the invention also includes division of longer gradients that exceed the boundaries of one or more partial acquisition partitions into two or more partial gradients. Division of a partial acquisition into multiple partial acquisition partitions has the advantage of being able to implement motion correction during a partial acquisition and to compensate, inter alia, for the motion-induced effects during application of long gradient pulses. The time-variable gradients that can be generated during large movements are interpolated between the partial gradients, taking the hardware specifications into account.

In a further preferred variant of this invention, correction deviations in previous partial acquisition partitions are detected during the current partial acquisition or partial acquisition partition and are corrected using additional gradient moments or phase changes before the signal read-out period or the next RF pulse. As part of this, the progression of the movement and the correction measures applied so far are analyzed in addition to the current object position. This further development has the advantage that deviations between the actual progression of the movement and the applied correction are detected and correction deviations of the previous partial acquisition partitions that have arisen because of this are detected during the current partial acquisition or partial acquisition partition. These correction deviations can be efficiently compensated for by means of additional gradient moments or phase changes before the signal read-out period or the next RF pulse. In particular, if such correction measures are used before the end of each refocusing interval (for example, in echo train sequences), this enables a reduction in disturbances of the spin magnetization state.

A variant of the above method is especially preferred in which the additional gradient moments for deviation correction are already superposed on existing gradients. This variant has the advantage that the temporal progression and the number of gradient pulses of the current acquisition used are retained, which enables minimization of further disturbing effects such as the eddy currents induced by gradient switching.

One embodiment of the invention that is very important under realistic conditions is characterized in that, when motion amplitude or velocity limits are exceeded, one or more partial acquisitions are rejected and repeated. To identify the corresponding phases, the criteria before the beginning of measurement are defined that prescribe either fixed threshold values for maximally acceptable object displacements or rotations, for maximum motion during a partial acquisition, or for maximum linear or angular velocities.

Alternately, such threshold values can be calculated automatically from analysis of acquired motion parameters considering MR sequence parameters. This variant has the advantage that exceeding the limits to be complied with for motion correction during individual partial acquisitions does not result in corruption of the result of the MR acquisition. This prevents the entire acquisition from having to be rejected and possibly repeated; instead, only individual partial acquisitions have to be repeated during the current MR acquisition, which results in only a moderate prolongation of the MR acquisition. One special feature of this embodiment as compared with the prior art is that fast movements within a partial acquisition in which the measurement object returns to the original position before the end of the partial acquisition are also correctly detected.

In a further embodiment of this invention, correction of a partial acquisition partition during or after calculation of the data required to perform the corresponding partial acquisition partition, such as temporal progressions of gradients, RF pulses, ADC settings, frequency and phase offsets, are performed by means of a software interface, wherein, for the calculation, this is performed using the current position data. This variant is especially advantageous because no major hardware modifications are required to implement the correction.

A further embodiment is characterized in that the correction of a partial acquisition partition is performed by means of a hardware interface. The advantages of this embodiment include both the possibility of corrections with only a small delay with especially short partial acquisition partitions and a certain independence from the MR scanner architecture and the details of the current MR acquisition.

A variant of the above method is especially preferred in which the hardware interface corrects the digital data of a partial acquisition partition after they are calculated but before they are converted to analog signals. After all data required to perform partial acquisition partition have been calculated, these digital data are modified according to their current position data. The advantage of this embodiment is low complexity of the hardware interface and the data modification to be performed.

A further embodiment is characterized in that the hardware interface corrects the analog control signals of a partial acquisition partition while they are being run. Correction of individual partial acquisition partitions is performed by means of an analog hardware interface wherein, after digital-to-analog conversion of the data of a partial acquisition or partial acquisition partition, the analog signals are modified based on the current position data. The advantages of this embodiment include the possibility of even faster corrections with still shorter partial acquisition partitions and greater independence from the MR scanner architecture and the current sequence. However, the stated advantages are obtained at the cost of increased complexity of the hardware interface.

In a further preferred embodiment of the method, a measurement system for sensing the object position is used that comprises at least one camera that determines the object position directly or using additional markers, in particular, one or more RGR (=retro grade reflectors) markers. To support position determination, one or more markers can be attached to the object to be examined. These markers can be both passive and active. Passive markers with RGR (=retro grade reflector) technology are especially advantageous because they enable very high measurement accuracy. The camera or cameras can be located outside or inside the tomograph.

In both cases, corresponding precautions for MR compatibility must be taken, in particular, for radio frequency shielding (RF shielding). One special advantage of this variant is that position sensing can be performed concurrently with MR acquisition and is therefore largely independent both of the scanner and of the type of current acquisition. Because markers are used, the position can be sensed more accurately and faster.

A further preferred variant of the invention is characterized in that at least one optical fiber is used to measure the object position. One end of each optical fiber is fixed to a stationary point; the other end is attached to the measurement object. The object position is determined by the deformation of the optical fiber or optical fibers occurring due to the movement of the object. Optical fibers have the advantage over cameras that they do not require a direct view of the measurement object or the marker or markers used.

A further preferred variant of the invention is characterized in that at least one MR navigator sequence is run and MR navigator signals are used to measure the object position. For this purpose, a short signal read-out period is inserted in the sequence progression that is supported by additional gradient pulses. For this variant, it is necessary to interrupt the signal progression of the MR acquisition. On one hand, MR navigator sequences can only be used for certain acquisitions and permit only a few corrections per second. On the other hand, this embodiment is advantageous because it does not require additional measurement apparatus for object position acquisition. It is also advantageous that the position sensing is performed in MR coordinates.

A further preferred variant of the invention is characterized in that the sensitivity of the RF coils is used to determine the object position. The current object position is derived from the signal strength in the individual RF coils. This is only possible using array coils and only exhibits limited accuracy but has the advantage of being faster than MR navigators. As with MR navigators, no additional measurement apparatus is required for object position sensing.

A further preferred variant of the invention is characterized in that at least one magnetic field sensor is used to measure the object position. Each of these magnetic field sensors measures the magnetic field at the corresponding sensor position. Information about the gradients being run at the time of measurement is combined with these measurement data and permits determination of the position of each sensor. One advantage is that only a few hardware components are required and that position acquisition is performed faster than for MR navigators and, what is more, in MR coordinates.

A further preferred variant of the invention is characterized in that additional signals, in particular, gradient pulses, RF pulses, and synchronization signals are run by the MR tomograph to support measurement of the object position. The object position should preferably be sensed throughout the entire MR scan. This can be performed in the timebase (preferably quasi-continuous) defined by the measurement method or measurement system or in the sequence triggered by additional signals, in particular, gradient pulses, RF pulses, and synchronization signals. The advantage of this variant results from time synchronization and synergetic functioning between the scanner and the position measurement system, with which better correction quality can be achieved. For example, the position can be determined by means of magnetic field sensors with additionally run gradients. However, these require interruption in the progression of the signal for the MR acquisition.

A further preferred variant of the invention is characterized in that the position data of the object to be represented are measured in six degrees of freedom, in particular, three translations and three rotations. The position measurement can be composed of one or more individual measurements and be performed by one or more sensors. The advantage is that all possible movements of a solid body can thereby be described and corrected in three-dimensional space.

A further preferred variant of the invention is characterized in that the position data of the object to be represented are measured in fewer than six degrees of freedom as long as the degrees of freedom required for the correction of the next partial acquisition partition are available. The extent to which a certain degree of freedom is relevant for the current partial acquisition partition is determined by whether the possible changes in this degree of freedom have an effect on the current partial acquisition partition. The position measurement can be composed of one or more individual measurements and be performed by one or more sensors. This embodiment has the advantage that the position sensing and correction can be greatly simplified for certain MR acquisitions.

A preferred usage variant is characterized in that the MR acquisition used is one of the known acquisition methods that is prone to motion artifacts, in particular, DWI, RARE, hyper-echo RARE, TRAPS-RARE, FLAIR, and gradient echo with flow encoding. The inventive corrections are especially advantageously used in conjunction with established and widespread MR acquisitions with increased proneness to signal disturbances and artifacts induced by object motion, such as diffusion-weighted imaging (DWI, DTI), T2-weighted echo-train-based imaging (RARE, TSE, FSE, TRAPS, hyper-echo, FLAIR) or gradient echo with flow encoding.

Another preferred embodiment is characterized in that the MR read-out method used is one of the known read-out methods that are prone to motion artifacts, in particular, EPI, spiral, rosette, HASTE, RARE, and bSSFP. After the signal generation phase, one of the established signal read-out methods is used, wherein the quasi-continuous correction according to this invention can be applied both during signal generation and during signal read-out. This is especially advantageous because the inventive corrections can be combined with traditional methods for signal read-out. The fast read-out methods such as EPI (=Echo Planar Imaging), spiral trajectory, rosette trajectory, HASTE (=Half fourier-Acquired Single shot Turbo spin Echo) and bSSFP (=Balanced Steady-State Free Precession) are especially preferred.

Please note that, depending on the read-out method, the inventive, temporal partitioning scheme has to be adapted to the MR sequence. It is thus especially advantageous for EPI read-out, to apply the position and gradient moment correction once for every one or two signal echo(s). On the other hand, the necessary adaptations of the HASTE method are more similar to the modifications of the general RARE sequence, which are described in more detail.

Further advantages of the invention can be derived from the description and the drawing. According to the invention, the characteristics stated above and described in more detail below can also be used singly or in any combination. The embodiments shown and described are not an exhaustive list but are examples to explain the invention.

The invention is shown in the drawing and is explained in more detail using examples.

BRIEF DESCRIPTION OF THE DRAWING

FIG. 8 images of two MR acquisitions (DWI) during large head movement.

DESCRIPTION OF THE PREFERRED EMBODIMENT

Figure 1:
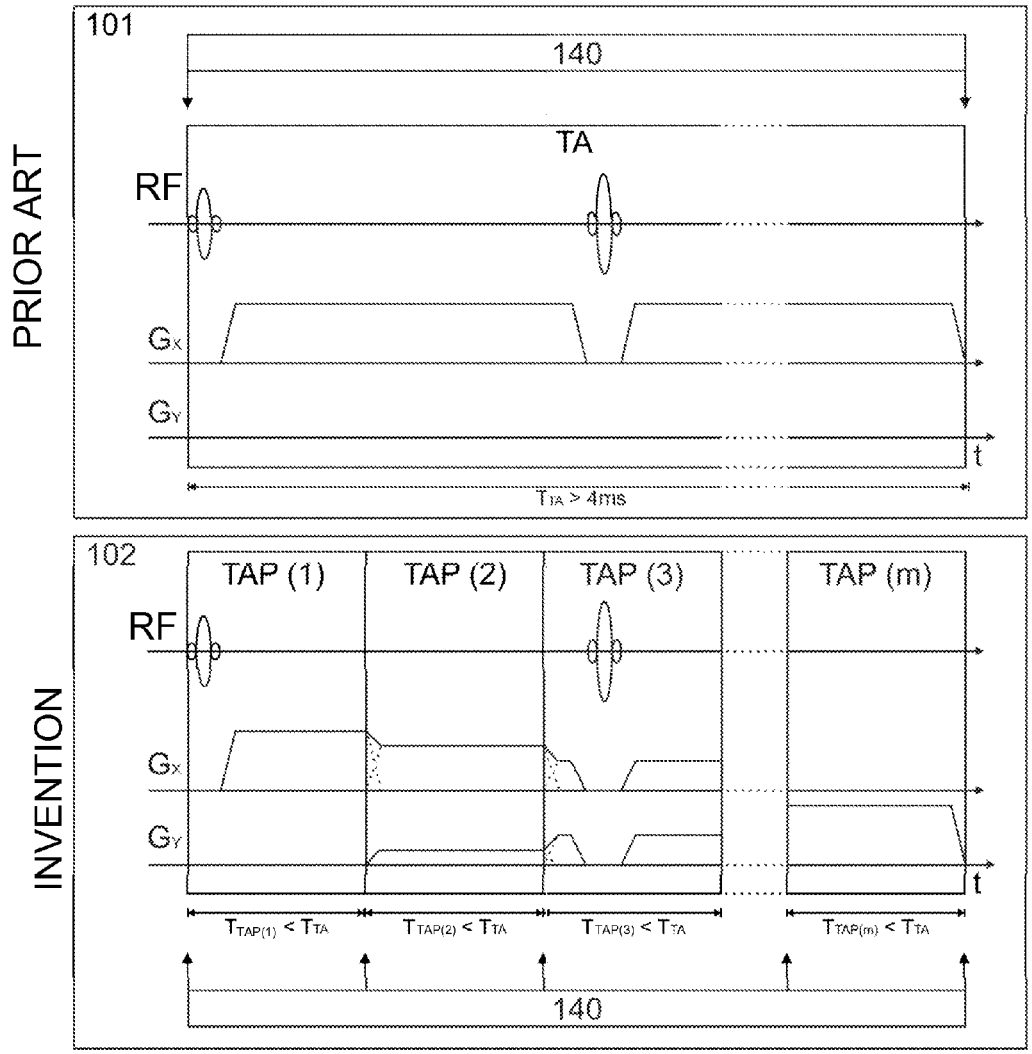
FIG. 1 a chart of the inventive method for dynamic motion correction during a partial acquisition.

FIG. 1 shows a chart of the method for dynamic motion correction during a partial acquisition TA, wherein the partial acquisition is divided into shorter partial acquisition partitions TAP(1), TAP(2), TAP(3), ..., TAP(m), wherein if long gradients are necessary they are divided into shorter partial gradients 101. The figures indicate the times for partial acquisition and for the partial acquisition periods with the symbols $T_{TA}$, $T_{TAP(1)}$, $T_{TAP(2)}$, $T_{TAP(3)}$ and $T_{TAP(m)}$, respectively. For comparison, the corresponding partial acquisition without the use of the described method is shown in 102. A partial gradient is always switched off when the following gradient begins. An uninterrupted transition results from the rise and decay time of a gradient. The measurement system 140 determines position data with which motion correction is performed.

The partial acquisition shown is the section of an MR acquisition for DWI. DWI is frequently used in everyday clinical practice to represent microscopic movements in the tissue that are a sensitive marker for many pathological phenomena. For this purpose, so-called diffusion gradients are used during signal encoding. Particle motion that occurs during the diffusion gradients required for diffusion weighting results in the spins not being completely refocused at the end of the signal encoding in voxels affected by the motion and in the subsequent measurement signal therefore being attenuated depending on the diffusion. However, sensitization to microscopic movements also makes the DWI sequence very prone to macroscopic movements. A further difficulty is that the resulting phase effects of the macroscopic movements clearly dominate those of the microscope movements.

Moreover, the typical time requirements for a diffusion-weighted signal encoding is in the range 30 to 400 ms. Previous conventional methods corrected movement only once at the beginning and at the end of this long time interval for signal encoding.

Object movement that occurs during the diffusion gradient and between slice excitation and the refocusing pulses that are typically used could not previously be corrected by known methods. The presented method permits uninterrupted adaptation of the diffusion gradients and the RF pulses to the object motion because of its quasi-continuous motion correction.

FIG. 1 shows how gradients are adapted to movement during a partial acquisition without interrupting the signal progression. The RF pulses used for refocusing are also adapted to the current object position during the corresponding partial acquisition without interrupting it.

In a further development of this approach, motion and correction progressions are analyzed during a partial acquisition. If motion amplitude or velocity limits are exceeded, one or more partial acquisitions may be rejected and repeated.

Figure 2:
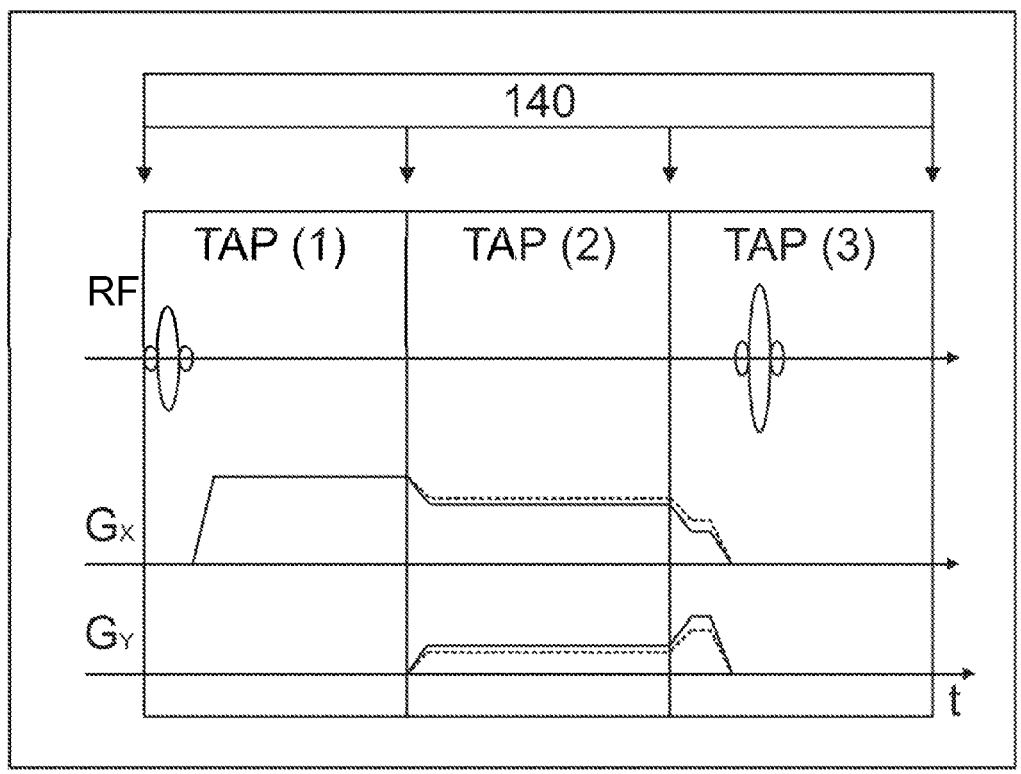
FIG. 2 a chart of a variant of the inventive method, wherein correction deviations in the previous partial acquisition partitions are corrected during the current partial acquisition or partial acquisition partition.

FIG. 2 shows a chart of a variant of the method according to FIG. 1, in which correction deviations in previous partial acquisition partitions are detected during the current partial acquisition or partial acquisition partition by analyzing the progression of the movement and are corrected before the next RF pulse by means of additional gradient moments or phase changes.

During calculation of the correction parameters of each partial acquisition partition, the best possible assumption about the object position is used for motion correction. If a better assumption about the object position at the beginning or information about movement during the corresponding partial acquisition partition becomes available as the partial acquisition progresses further, the difference between the position used for correction and the real position can be calculated and corrected with additional gradient moments. In the described variant of the inventive method, these additional gradient moments are superposed on the existing gradients.

Figure 3:
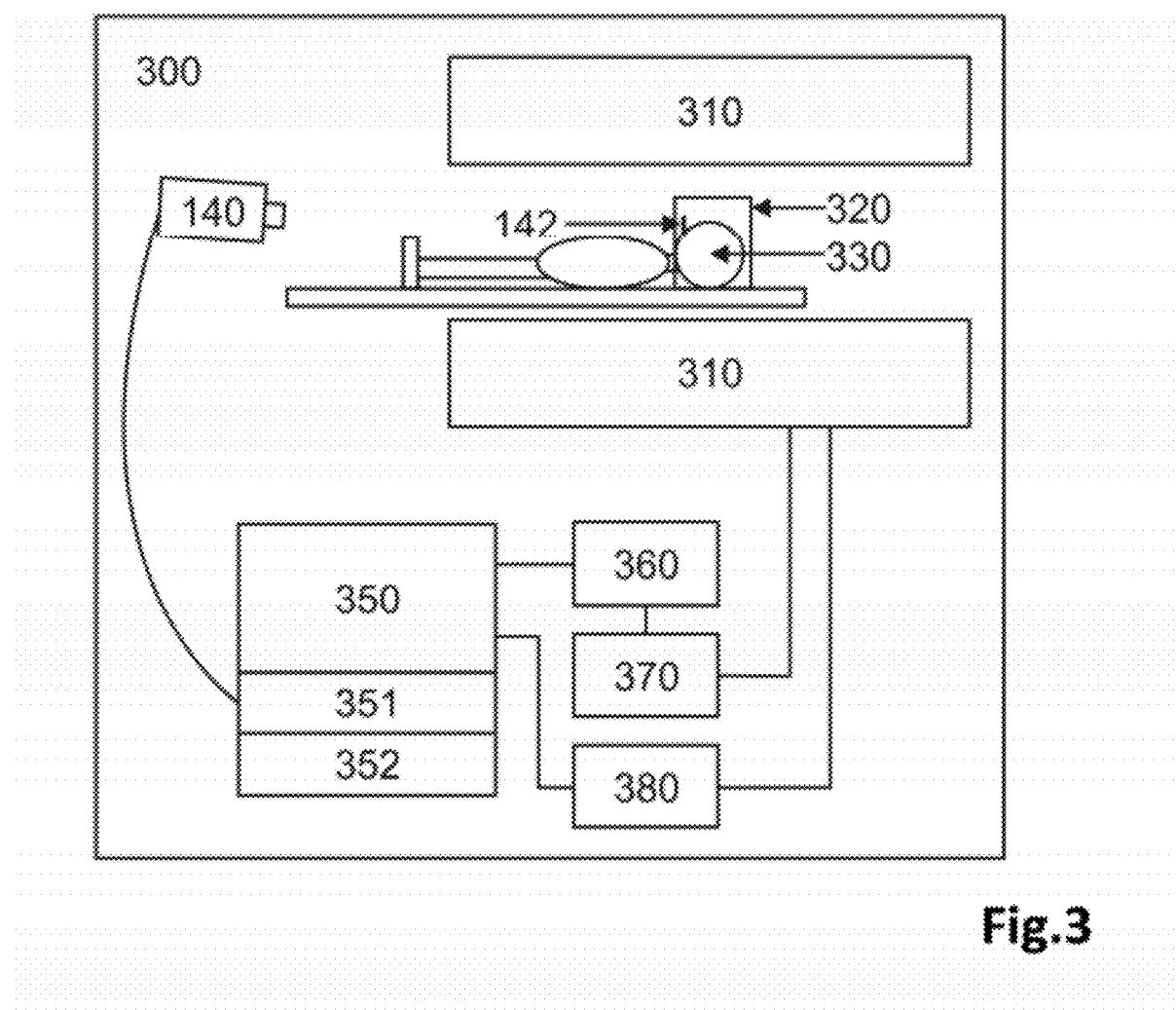
FIG. 3 a diagram of a variant of a configuration of the inventive method, wherein correction of a partial acquisition partition is achieved by means of a software interface.

FIG. 3 shows a variant of the configuration of the inventive method for prospective motion correction. The configuration 300 contains a tomograph 310 with a receiver coil 320 and a measurement object 330 to be represented. The configuration also contains a measurement system 140 for sensing the patient position. The configuration 300 also contains a real-time module 350 with a calculation module 351 and a software interface 352, as well as a signal generator module 360, an amplifier unit 370, and a receiver module 380.

In one variant of the inventive method, the calculation module 351 converts the position data of the measurement system 140 into the reference system of the MR system 310 and calculates all sequence parameters from the sequence source code using the software interface 352.

The software interface 352 uses the processed position data for motion correction of all sequence parameters while they are calculated in the calculation module 351.

Figure 4:
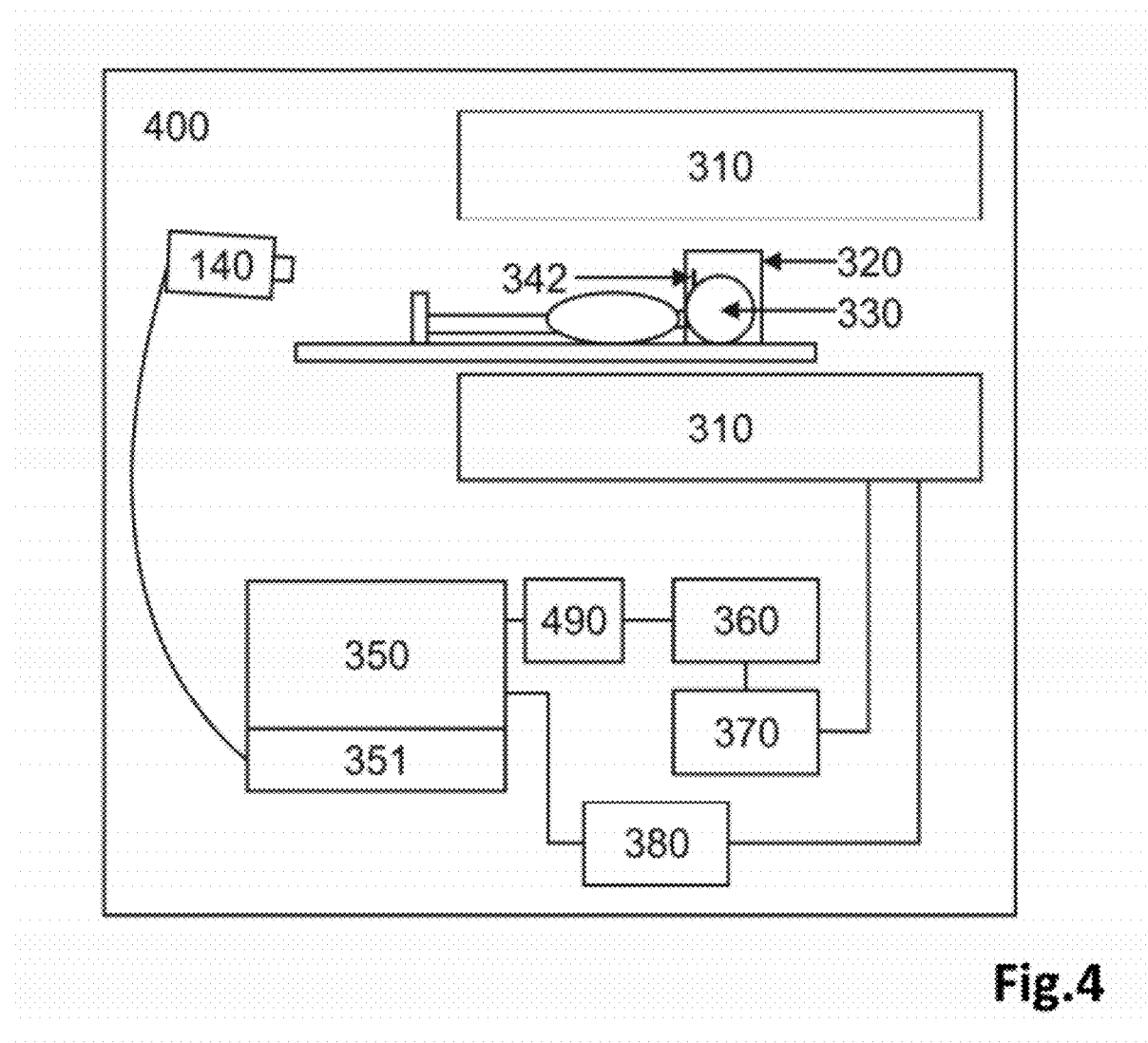
FIG. 4 a diagram of a variant of a configuration of an inventive method, wherein correction of the digital signals of a partial acquisition partition is performed after they have been calculated but before they have been converted to analog signals by means of a hardware interface.

FIG. 4 shows a further variant of the configuration of the inventive method for prospective motion correction. The configuration 400 contains a tomograph 310 with a receiver coil 320 and a measurement object 330 to be represented. The configuration also contains a measurement system 140 for sensing the patient position. The configuration 300 also contains a real-time module 350 with a calculation module 351, as well as a signal generator module 360, an amplifier unit 370, and a receiver module 380. A hardware interface 490 is connected upstream of the signal generator module. In one variant of the inventive method, the calculation module 351 converts the position data of the measurement system 140 into the reference system of the MR system 310 and calculates all sequence parameters from the sequence source code.

The hardware interface 490 uses the processed position data for motion correction by modifying the digital signals of the real-time module 350 to the signal generator module 360.

Figure 5:
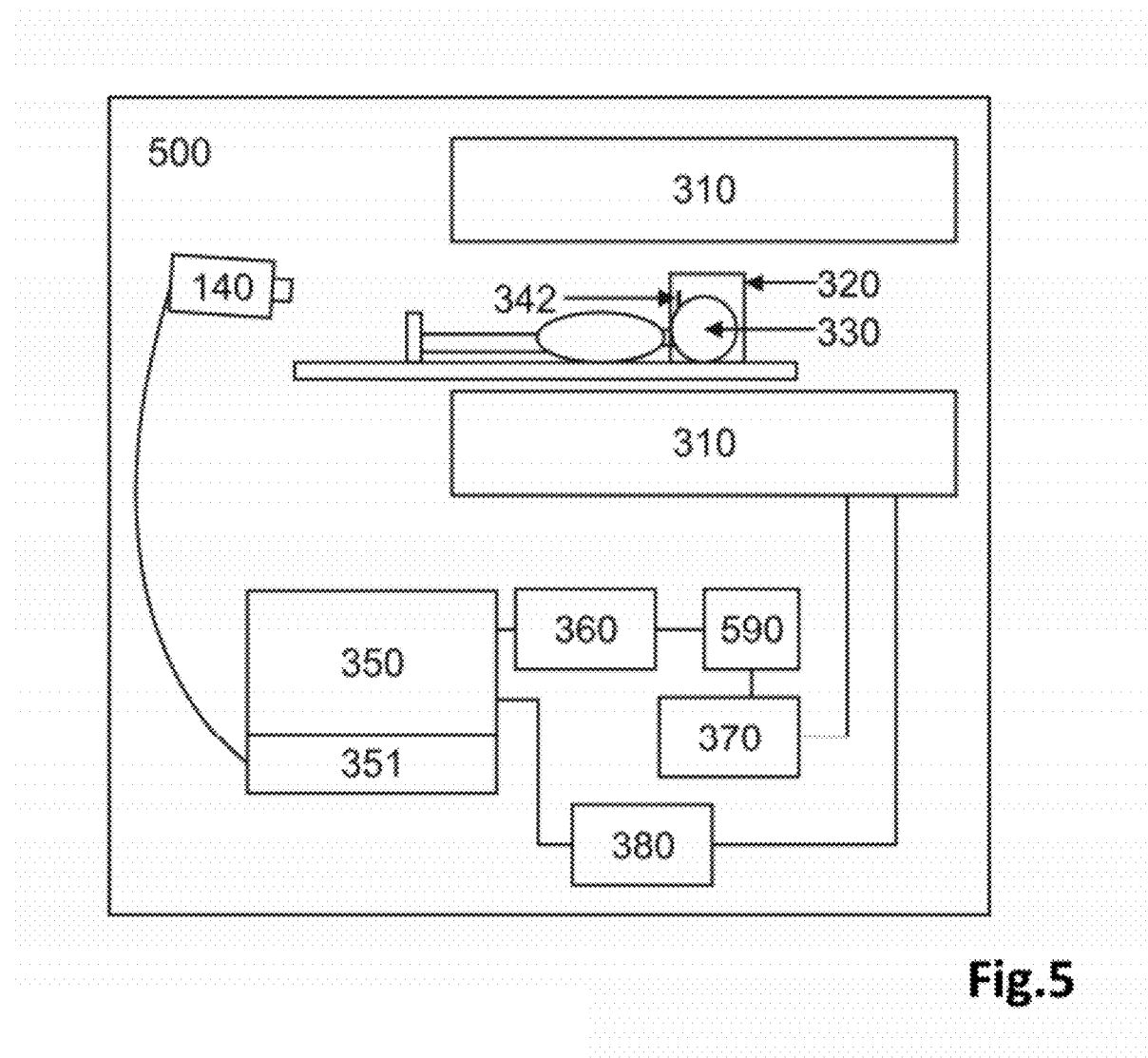
FIG. 5 a diagram of a configuration of a variant of the inventive method wherein a hardware interface corrects the analog control signals of a partial acquisition partition while it is being run.

FIG. 5 shows a further variant of the configuration of the inventive method for prospective motion correction. The configuration 500 contains a tomograph 310 with a receiver coil 320 and a measurement object 330 to be represented. The configuration further contains a measurement system 140 for sensing the patient position. The configuration 500 also contains a real-time module 350 with a calculation module 351, as well as a signal generator module 360, an amplifier unit 370, and a receiver module 380. A hardware interface 590 is connected upstream of the amplifier unit 370.

In one variant of the inventive method, the calculation module 351 converts the position data of the measurement system 140 into the reference system of the MR system 310 and calculates all sequence parameters from the sequence source code.

The hardware interface 590 uses the processed position data for motion correction by modifying the analog signals of the real-time module 350 to the signal generator module 360.

Figure 6:
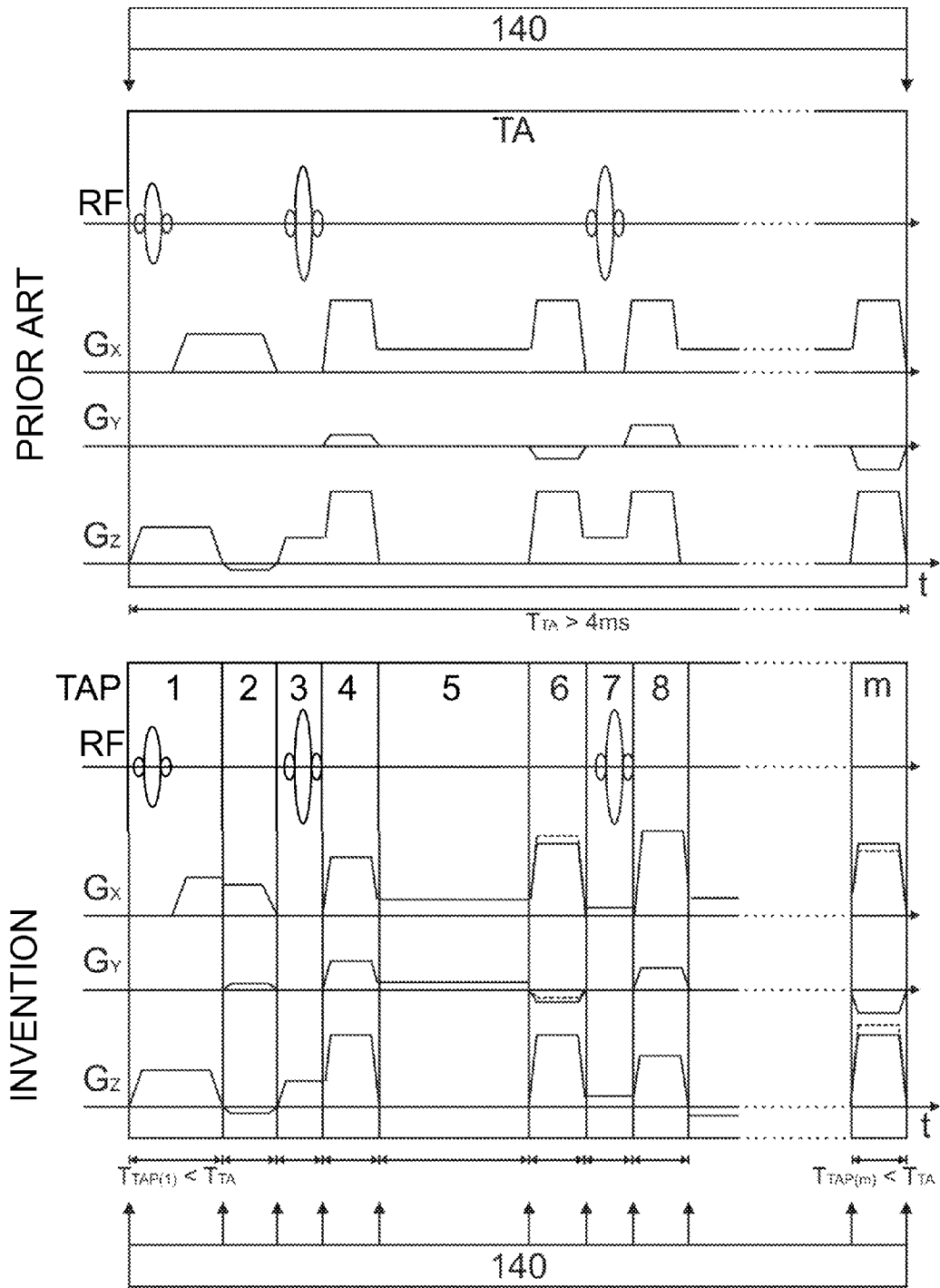
FIG. 6 a chart of a partial acquisition of an echo-train-based MR acquisition (RARE) that is corrected using an inventive method.

FIG. 6 shows a further chart of a partial acquisition of an MR acquisition that was corrected using the presented method. The partial acquisition shown is part of a RARE sequence. The RARE (Rapid Acquisition with Relaxation Enhancement) sequence, also known as TSE or FSE (Turbo or Fast Spin Echo) sequence, is a widespread imaging sequence and a very common read-out module in MR. Although its signal behavior is usually regarded as robust, the RARE sequence does exhibit a noticeable proneness to artifacts because of movements during its long acquisition time—in the range of approx. 1 second to several minutes—and its application of numerous, partially combined gradients and RF pulses.

A RARE sequence is either run as a so-called single-shot variant in the form of HASTE etc. or as a so-called multi-shot variant that is originally also known as hybrid RARE. The former has only one excitation pulse with a large number of following refocusing pulses, while the latter repeats the sequence of excitation pulses with refocusing pulses at repetition intervals of the duration TR (repetition time), that is typically in the range approx. 0.5 seconds to several seconds. Previously conventional methods corrected motion in the case of the RARE sequence only once at the beginning or end of the RARE echo train, typically before slice excitation.

In the case of RARE-based MR sequences, once-only motion correction per repetition interval is disadvantageous not only because of the long repetition interval, but also extremely problematic because of the essential phase stability of a RARE sequence that is widely known as CPMG (Carr-Purcell-Meiboom-Gill) conditions. Each movement within a repetition interval results in sensitive disturbances of the phase stability and therefore very soon in image artifacts in a RARE-based MR sequence.

Because of its quasi-continuous motion correction, the presented method ensures that these CPMG conditions are met even in the presence of object movements and is therefore a precondition for operating a RARE sequence with motion correction. Looked at in special detail, the following three aspects are required:

1.) To ensure the CPMG conditions (phase stability) are met, a RARE-based sequence must keep to the following timing schedule: The first refocusing interval—mid excitation pulse to mid first refocusing pulse—must be half as long as the following refocusing intervals—mid refocusing pulse number N to mid next refocusing pulse number N+1. The presented method permits this because it does not require any time within the timing schedule.
2.) It is essential that the gradient area—also termed zeroth moment—is constant for each encoding axis (Gx, Gy and Gz) per refocusing interval, and is exactly half the size in the first refocusing interval as in the following refocusing interval. The presented inventive method enables this by correcting the gradients quasi-continuously in the case of movements and thus achieving and ensuring this necessary phase stability directly in the actual, measured object. In this case, "gradients" refers to all different function types of gradients used in a RARE, such as read-out encoding, phase encoding, slice selection, crusher, spoiler, etc. In particular, the presented method optionally makes use of the fact that additional gradient moments or phase changes are applied before the end of each refocusing interval. These gradient moments for deviation correction can already be superposed on existing gradients, which does not demand any time within the timing schedule.
3.) It is also essential that the originally set phase relationships of the RF pulses, the so-called initial phases, are retained. The presented method permits this by adapting the carrier frequencies and phases of the RF pulses according to the motion correction so that the intended, initial phases of the RF pulses are retained in the measured object.

The general nature of the proposed principle permits both motion correction on conventional RARE types (RARE, TSE, FSE, HASTE etc.) with constant flip angles and constant initial phases for the refocusing pulses, and the more modern variants with variable flip angles and constant initial phases for refocusing pulses (TRAPS, hyperTSE, SPACE, CUBE, VISTA etc.) or variable flip angles and alternating initial phases (generalized CPMG conditions). For all types, any excitation pulse can be used, from the flip angle at the same phase or a phase shifted by 90° to the first refocusing pulse.

Moreover, due to the general nature of the approach, RARE-like sequences are also possible and included that still meet the CPMG conditions for the gradients but keep both the initial phases and the flip angle for refocusing pulses and excitation pulse variable, such as, for example, RARE sequences that follow the hyperecho principle.

Only a method that performs all these motion corrections achieves artifact-free images in a RARE-based imaging sequence or a RARE-based read-out module.

Figure 7:
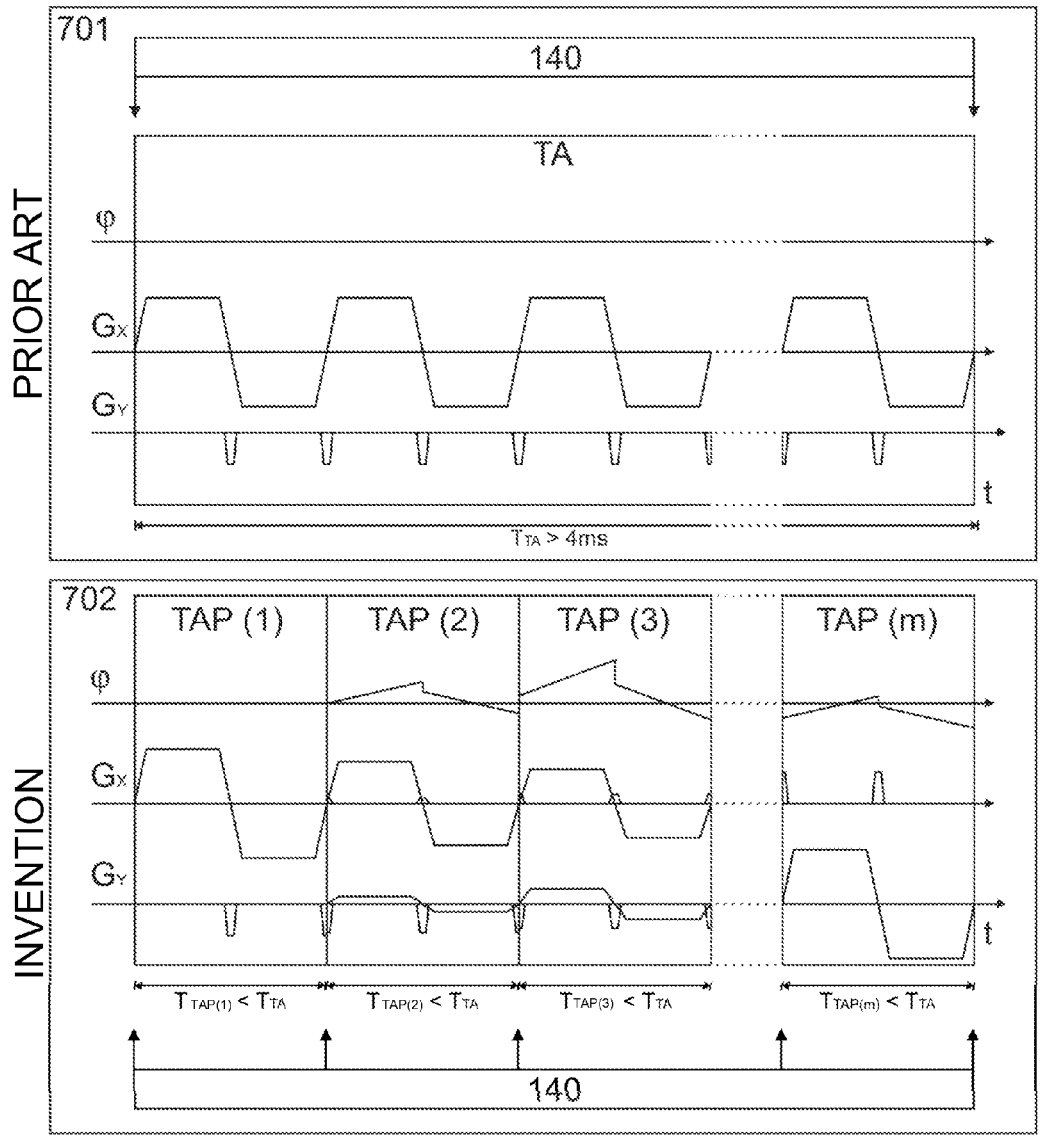
FIG. 7 a chart of a partial acquisition of an echo planar signal acquisition (EPI) that was corrected using the inventive method.

FIG. 7 shows a chart of a variant of the inventive method, wherein information about the object position is used during the read-out procedure to implement motion correction. For comparison, the corresponding partial acquisition is shown without the use of the described method. The read-out method depicted shows the frequently used echo planar imaging (EPI). EPI permits read-out of a whole MR data set after only one signal encoding and is therefore considered to be particularly resistant to motion artifacts. However, the duration of such a read-out operation is typically 50-100ms and motion that occurs in this period results in artifacts. Methods that have been used so far only permit once-only motion correction at the beginning of the EPI, and motion that may occur during the read-out operation cannot be corrected by these methods. Moreover, other read-out methods with a longer duration (>4ms) (e.g. spiral, rosette, etc.) also benefit from the inventive method.

A variant of the method is especially preferred in which the object position is determined in 6 degrees of freedom (in particular, 3 translations and 3 rotations) because this permits a complete description of a solid body.

In a further variant of the method, an object position in less than 6 degrees of freedom can be used for motion correction. This is possible if, within a partial acquisition partition, all degrees of freedom responsible for possible motion artifacts are known. The motion correction of TAP(2) in FIG. 1 is cited by way of example. For the motion correction to be applied, in this case, it is enough to determine the object position in 2 degrees of freedom (2 rotations around the axes orthogonal with respect to the gradient direction).

In a variant of the method, information about the previous progression of the movement is also used in determining the object position. Using kinematic models (e.g. Kalman filters), it is possible to adapt the motion correction accordingly. With this method, it is possible, for example, to reduce errors due to delays in the signal progression or inaccuracies due to signal noise. The best possible correction can also be calculated and applied during detection of motion patterns that do not correspond to those of a solid body.

Further advantages of the invention result from combining the basic principles explained in FIGS. 1 to 7. Thus, the characteristics stated above and described in more detail can be used singly or in any combination according to the invention. The embodiments shown and described are not an exhaustive list but are examples to explain the invention.

FIG. 8 shows images of two MR acquisitions (DWI), 801 showing an MR acquisition in which the motion correction was performed once before slice excitation and 802 showing an MR acquisition in which the motion correction was applied during diffusion weighting according to the inventive method. Comparably large head movements occurred during both acquisitions. Whereas in the first acquisition 801, signal losses can be seen, these signal losses are prevented in the second acquisition 802. Comparison of the two acquisitions clearly shows the advantages of the inventive method.

REFERENCES

[1] Bammer, R., Apparatus and method for real time motion-compensated magnetic resonance imaging. 2007, US 2009/0209846 A1.
[2] Runge, V. M., et al., *Respiratory gating in magnetic resonance imaging at 0.5 Tesla. Radiology*, 1984. 151(2): p. 521-523.
[3] Odille, F., et al., *Generalized Reconstruction by Inversion of Coupled Systems (GRICS) applied to free-breathing MRI. Magnetic Resonance in Medicine*, 2008. 60(1): p. 146-157.
[4] White, N., et al., *PROMO: Real-Time Prospective Motion Correction in MRI Using Image-Based Tracking.* Magnetic Resonance in Medicine, 2010. 63(1): p. 91-105.
[5] Norris, D. G. and W. Driesel, *Online motion correction for diffusion-weighted imaging using navigator echoes: Application to RARE imaging without sensitivity loss.* Magnetic Resonance in Medicine, 2001. 45(5): p. 729-733.
[6] Zaitsev, M., et al., *Magnetic resonance imaging of freely moving objects: Prospective real-time motion correction using an external optical motion tracking system.* Neuroimage, 2006. 31(3): p. 1038-1050.
[7] Ernst, T. M., T. E. Prieto, and B. S. R. Armstrong, Motion tracking system for real time adaptive imaging and spectroscopy. 2007, WO 2007/136745 A2.
[8] Dold, C., Reducing movement artifacts in magnetic resonance measurements. 2004, U.S. Pat. No. 7,295,007 B2.
[9] Aksoy, M., et al., *Real-time optical motion correction for diffusion tensor imaging.* Magnetic Resonance in Medicine: early review online, DOI 10.1002/mrm.22787.
[10] Andrews-Shigaki, B. C., et al., *Prospective motion correction for magnetic resonance spectroscopy using single camera retro-grate reflector optical tracking.* Journal of Magnetic Resonance Imaging. 33(2): p. 498-504.
[11] J. L. Duerk, *Principles of MR image formation and reconstruction*, Magn Reson Imaging Clin N Am, vol. 7, pp. 629-659, November 1999.

We claim:

1. A method of MR (=magnetic resonance) imaging and spectroscopy for reducing artifacts occurring due to motion of an object being imaged in an MR tomograph, the method comprising the steps of:
   a) monitoring an object position during a runtime of MR acquisition, the MR acquisition having one or more partial acquisitions (TA);
   b) performing motion correction through dynamic adaptation of frequency and phase settings of an RF (=radio frequency) system of the tomograph and through orientations and amplitudes of gradients during the runtime of the MR acquisition and in dependence on changes in the object position monitored in step a), the motion correction being applied between and/or during a signal weighting period and a signal read-out period, wherein the dynamic adaptations are performed without interrupting or slowing a temporal progression of the MR acquisition; and
   c) repeating step b) at least once during the runtime of the MR acquisition, wherein long partial acquisitions (TA) are divided into shorter partial acquisition partitions (TAP) and long gradients that extend in time over a boundary between two consecutive partial acquisition partitions (TAP) are divided into shorter partial gradients in such a way that each partial gradient is only switched during a single partial acquisition partition (TAP).

2. The method of claim 1, wherein correction deviations in previous partial acquisition partitions (TAP) are detected during a current partial acquisition (TA) or partial acquisition partition (TAP) and are corrected using additional gradient moments or phase changes before the signal read-out period or before a next RF pulse.

3. The method of claim 2, wherein the additional gradient moments for deviation correction are superposed on existing gradients.

4. The method of claim 1, wherein, when motion amplitude or velocity limits are exceeded, one or more partial acquisitions (TA) are rejected and are repeated.

5. The method of claim 1, wherein correction of a partial acquisition partition (TAP) during or after calculation of data required to perform a corresponding partial acquisition partition (TAP) is performed by means of a software interface.

6. The method of claim 1, wherein correction of a partial acquisition partition (TAP) is performed by means of a hardware interface.

7. The method of claim 6, wherein the hardware interface corrects digital data of a partial acquisition partition (TAP) after calculation but before conversion to analog signals.

8. The method of claim 6, wherein the hardware interface corrects analog control signals of a partial acquisition partition (TAP) while the signals are being run.

9. The method of claim 1, wherein a measurement system for sensing the object position comprises at least one camera, wherein the camera determines the object position directly, using additional markers or using one or more RGR (=retro grade reflector) markers.

10. The method of claim 1, wherein at least one optical fiber is used to measure the object position.

11. The method of claim 1, wherein at least one MR navigator sequence is run and MR navigator signals are used to measure the object position.

12. The method of claim 1, wherein a sensitivity of RF coils is used to determine the object position.

13. The method of claim 1, wherein at least one magnetic field sensor is used to measure the object position.

14. The method of claim 1, wherein the MR tomograph generates additional signals, additional gradient pulses, additional RF pulses or synchronization signals for supporting measurement of the object position.

15. The method of claim 1, wherein position data of the object to be represented are measured in six degrees of freedom or with three translations and three rotations.

16. The method of claim 1, wherein position data of the object to be represented are measured in fewer than six degrees of freedom but including degrees of freedom required for correction of a next partial acquisition partition (TAP).

17. The method of claim 1, wherein an acquisition method is used for MR acquisition that is a method sensitive to motion artifacts, a DWI method, a RARE method, a hyperecho RARE method, a TRAPS-RARE method, a FLAIR method or a gradient echo method with flow encoding.

18. The method of claim 1, wherein an MR read-out method is used that is a method sensitive to motion artifacts, an EPI method, a spiral method, a rosette method, a HASTE method, a RARE method or a bSSFP method.

* * * * *